(12) United States Patent
Gardner et al.

(10) Patent No.: US 6,429,052 B1
(45) Date of Patent: Aug. 6, 2002

(54) METHOD OF MAKING HIGH PERFORMANCE TRANSISTOR WITH A REDUCED WIDTH GATE ELECTRODE AND DEVICE COMPRISING SAME

(75) Inventors: Mark I. Gardner, Cedar Creek; John J. Bush, Leander; Frederick N. Hause, Austin, all of TX (US)

(73) Assignee: Advanced Micro Devices, Inc., Austin, TX (US)

( * ) Notice: Subject to any disclaimer, the term of this patent is extended or adjusted under 35 U.S.C. 154(b) by 58 days.

(21) Appl. No.: 09/711,401

(22) Filed: Nov. 13, 2000

(51) Int. Cl.$^7$ .......................... H01L 21/8232
(52) U.S. Cl. ................................. 438/142
(58) Field of Search .................. 438/142, 285, 438/483, 592

Primary Examiner—Richard Elms
Assistant Examiner—Beth E. Owens

(74) Attorney, Agent, or Firm—Williams, Morgan & Amerson, P.C.

(57) ABSTRACT

The present invention is directed to a method for manufacturing a high performance transistor device with a reduced width or "t-shaped" gate electrode. The method disclosed herein comprises forming a gate insulation layer on a semiconducting substrate, forming a layer of polysilicon above the gate insulation layer, forming a layer of amorphous silicon above the layer of polysilicon, and patterning the layer of polysilicon and the layer of amorphous silicon to define a gate structure. The method further comprises reducing the width of the layer of polysilicon and the layer of amorphous silicon by performing an oxidation process, whereby the layer of polysilicon has a post-oxidation width that is less than the post-oxidation width of the layer of amorphous silicon, and forming a plurality of source/drain regions in the substrate adjacent the gate electrode of the device.

19 Claims, 4 Drawing Sheets

METHOD OF MAKING HIGH PERFORMANCE TRANSISTOR WITH A REDUCED WIDTH GATE ELECTRODE AND DEVICE COMPRISING SAME

BACKGROUND OF THE INVENTION

1. Field of the Invention

The present invention is generally related to the field of semiconductor processing and, more particularly, to a method of making a high performance transistor with a reduced width gate electrode and device incorporating same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate dielectric thickness, and the like, are reduced. For example, all other things being equal, the smaller the channel length of the FET, the faster the transistor will operate. Thus, there is a constant drive to reduce the size, or scale, of the components of a typical transistor to increase the overall speed of the transistor, as well as integrated circuit devices incorporating such transistors. Additionally, reducing the size, or scale, of the components of a typical transistor also increases the density, and number, of the transistors that can be produced on a given amount of wafer real estate, lowering the overall cost per transistor as well as the cost of integrated circuit devices incorporating such transistors.

By way of background, an illustrative prior art transistor 1 is depicted in FIG. 1. As shown therein, the transistor 1 is formed in an active region 2 of a semiconducting substrate 3 that is defined by trench isolation regions 7. The transistor 1 generally comprises a gate electrode 3, a gate insulation layer 4, a sidewall spacer 5 and a plurality of source/drain regions 6. The transistor 1 may be fabricated using a variety of known processing techniques. For example, the transistor 1 may be fabricated by forming the trench isolation regions 7 in the substrate 3, and, thereafter, forming the gate electrode 3 and gate insulation layer 4 by forming the appropriate layers of material and patterning those layers using traditional photolithography and etching processes. In one embodiment, the gate insulation layer 4 may be comprised of silicon dioxide, and the gate electrode 3 may be comprised of poly-crystalline silicon (polysilicon). Thereafter, an initial ion implantation process is performed to define extension implant regions within the substrate that are generally self-aligned with respect to the gate electrode 3. Then, the sidewall spacer 5 is formed by depositing an appropriate layer of material, e.g., silicon dioxide, silicon nitride, etc., and thereafter performing an anisotropic etching process. After the spacer 5 is formed, a second ion implantation process, i.e., a source/drain implant, is performed to form source/drain implant regions in the substrate. Thereafter, one or more anneal processes are performed to activate the implanted dopant ions and to repair any damage to the lattice structure of the substrate.

However, one problem with prior art transistor devices, such as the illustrative transistor 1 depicted in FIG. 1, is that, to the extent the extension portions of the source/drain region extend under the gate electrode 3, a capacitor is formed. This capacitor must be charged and discharged on every switching cycle of the transistor 1. This results in delays in the switching speed of the transistor, and in excessive power consumption, a characteristic that is particularly unwanted in portable electronic devices.

The present invention is directed to solving, or at least reducing, some or all of the aforementioned problems.

SUMMARY OF THE INVENTION

The present invention is directed to a novel transistor device and a method of making same. In one illustrative embodiment, the transistor comprises a substrate, a gate insulation layer positioned above the substrate, and a gate electrode positioned above the gate insulation layer. The gate electrode is comprised of a layer of polysilicon and a layer of amorphous silicon positioned above the layer of polysilicon, wherein the layer of amorphous silicon has a width that is greater than the width of the layer of polysilicon. The transistor further comprises a source region and a drain region formed in the substrate adjacent the gate electrode.

In one illustrative embodiment, the method disclosed herein comprises forming a gate insulation layer on a semiconducting substrate, forming a layer of polysilicon above the gate insulation layer, forming a layer of amorphous silicon above the layer of polysilicon, and patterning the layer of polysilicon and the layer of amorphous silicon to define a gate structure. The method further comprises reducing the width of the layer of polysilicon and the layer of amorphous silicon by performing an oxidation process, whereby the layer of polysilicon has a post-oxidation width that is less than the post-oxidation width of the layer of amorphous silicon, and forming a plurality of source/drain regions in the substrate adjacent the gate electrode of the device.

BRIEF DESCRIPTION OF THE DRAWINGS

The invention may be understood by reference to the following description taken in conjunction with the accompanying drawings, in which like reference numerals identify like elements, and in which.

Figure 1:
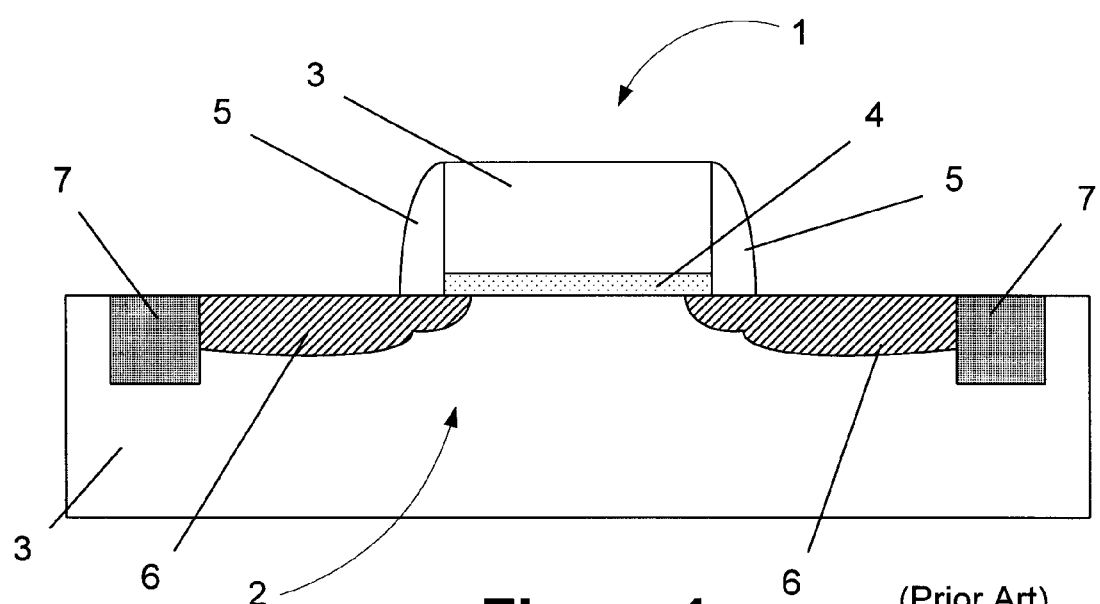
FIG. 1 is a cross-sectional view of an illustrative prior art transistor.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 2–8. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and regions depicted in the drawings may be exaggerated or reduced as compared to the size of those features or regions on fabricated devices. Nevertheless, the attached drawings are included to describe and explain illustrative examples of the present invention.

In general, the present invention is directed to a method of making a high performance transistor with a gate electrode having a reduced width, and a device incorporating same. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

Figure 2:
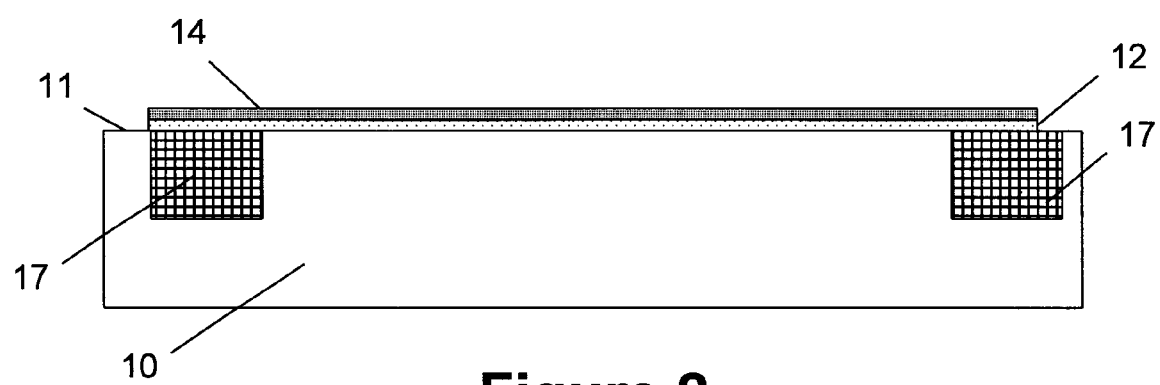
FIG. 2 is a cross-sectional view of a semiconducting substrate having a plurality of process layers formed thereabove in accordance with one embodiment of the present invention.

As shown in FIG. 2, a plurality of trench isolation regions 17 are formed in a semi-conducting substrate 10. Thereafter, a gate insulation layer 12 is formed above a surface 11 of the semiconducting substrate 10, and a cap layer 14 is formed above the insulation layer 12. The semiconducting substrate 10 may be comprised of a variety of materials, such as silicon.

The gate insulation layer 12 may be comprised of a variety of materials, such as an oxide, a nitrogen-bearing oxide, silicon dioxide, silicon nitride, or a variety of "high k" materials such as zirconium oxide ($ZrO_2$), hafnium oxide ($HfO_2$), i.e., materials having a dielectric constant greater than approximately 8. The gate insulation layer 12 may have a thickness that ranges from approximately 8–25 Å and it may be made by a variety of processes, such as chemical vapor deposition (CVD), thermal growth, physical vapor deposition (PVD), or any other technique known for making the materials comprising the gate insulation layer 12. In one illustrative embodiment, the gate insulation layer 12 is comprised of a layer of silicon dioxide that is made by a thermal growth process, and it has a thickness of approximately 8–20 Å.

The cap layer 14 may also be comprised of a variety of materials, such as a nitride, silicon nitride, tantalum nitride, titanium nitride, etc. The cap layer 14 may be made by a variety of process techniques, e.g., CVD, PVD, etc., and it may have a thickness that ranges from approximately 3–10 Å. In one illustrative embodiment, the cap layer 14 is comprised of a layer of silicon nitride that is formed by a CVD process to a thickness of approximately 3–8 Å.

Figure 3:
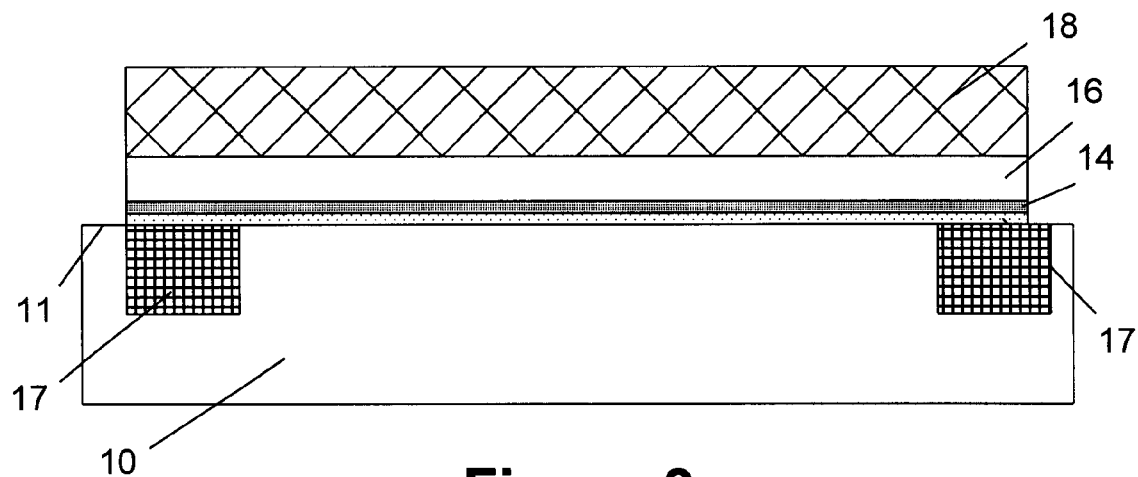
FIG. 3 is a cross-sectional view of the substrate shown in FIG. 2 after a layer of polysilicon and a layer of amorphous silicon have been formed thereabove.

Next, as shown in FIG. 3, a layer of polysilicon 16 and a layer of amorphous silicon 18 are formed above the structure depicted in FIG. 1. In one illustrative embodiment, the formation of the polysilicon layer 16 and the amorphous silicon layer 18 may be accomplished by the initial formation of the polysilicon layer 16 followed by in situ formation of the amorphous silicon layer 18. More particularly, the polysilicon layer 16 may be formed in a CVD chamber at a temperature ranging from approximately 600–640° C. and, thereafter, the amorphous silicon layer 18 may be formed in the same chamber, i.e., in situ, at a temperature ranging from approximately 520–580° C. Thus, by appropriate temperature control, an in situ process may be used whereby the polysilicon layer 16 is formed first and the amorphous silicon layer 18 is formed thereafter. The polysilicon layer 16 and the amorphous silicon layer 18 may be formed by a variety of deposition techniques, e.g., CVD, LPCVD, etc. The thickness of the polysilicon layer 16 and the amorphous silicon layer 18 may be varied. In one illustrative embodiment, the thickness of the polysilicon layer 16 may range from approximately 100–300 Å, and the thickness of the amorphous silicon layer 18 may range from approximately 500–1500 Å. Of course, if desired, the polysilicon layer 16 and the amorphous silicon layer 18 may be formed by separate deposition processes performed at different times in separate deposition chambers.

Figure 4:
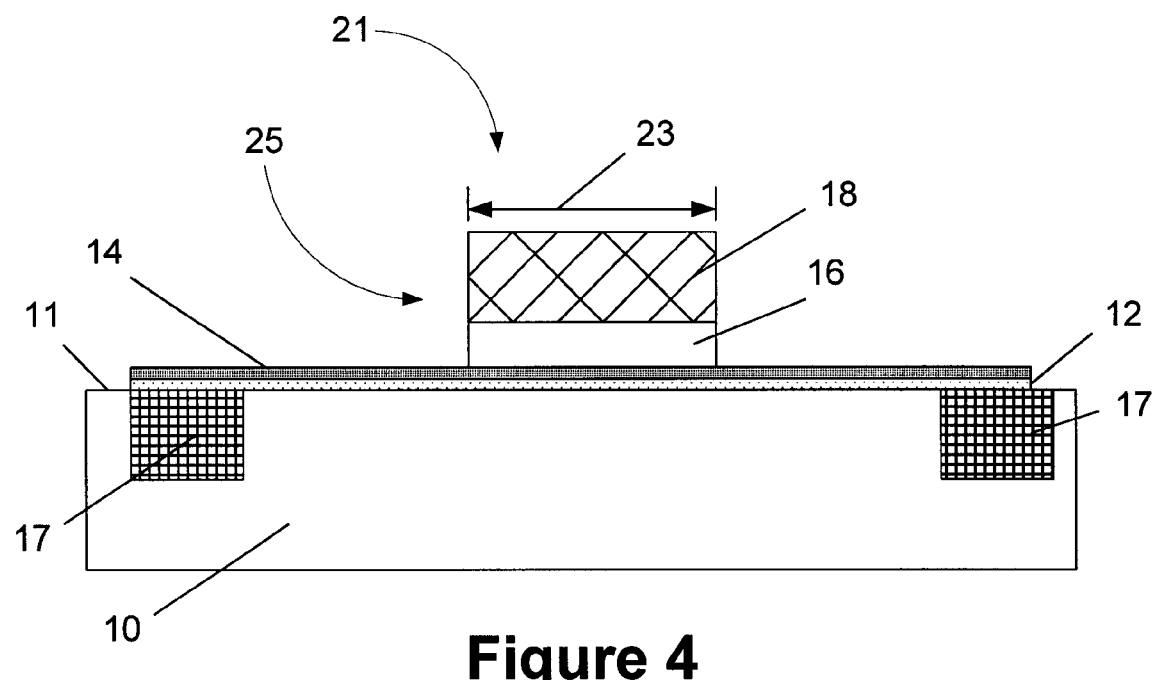
FIG. 4 is a depiction of the substrate shown in FIG. 3 after the layer of polysilicon and the layer of amorphous silicon have been patterned.

Next, as shown in FIG. 4, traditional photolithography and etching processes are performed to pattern the polysilicon layer 16 and the amorphous silicon layer 18, thereby resulting in the gate structure 21 depicted in FIG. 4. The gate structure 21 has a patterned IQ=, width 23 that may vary and, in one embodiment, ranges from approximately 600–1200 Å. That is, both the polysilicon layer 16 and the amorphous silicon layer 18 may have widths that are approximately equal to the width 23 indicated in FIG. 4. Of course, on actual devices, there may be some degree of tapering of the sidewalls 25 of the gate structure 21. In one illustrative embodiment, the gate structure 21 depicted in FIG. 4 may be achieved by performing one or more anisotropic etching processes, e.g., a plasma etching process using the appropriate etch chemistries.

Figure 5:
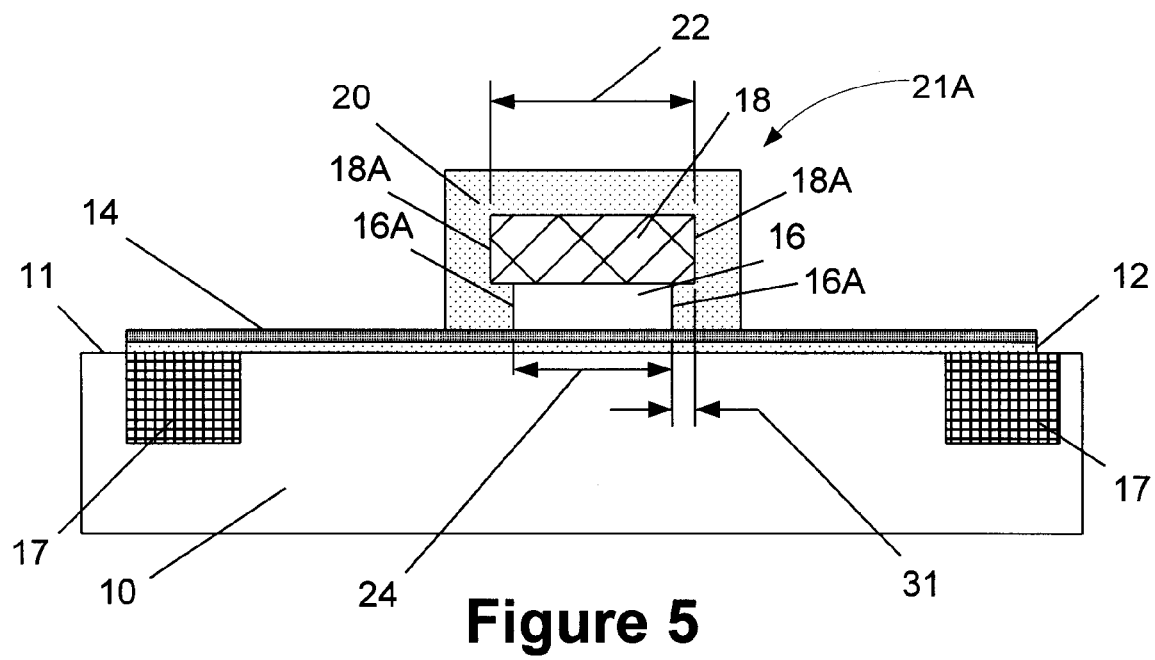
FIG. 5 is a cross-sectional view of the device shown in FIG. 4 after an oxidation operation has been performed.

With reference to FIG. 5, the next step involves performing an oxidation process to form an oxide material 20 adjacent the polysilicon layer 16 and the amorphous silicon layer 18. The polysilicon layer 16 will oxidize at a faster rate than the amorphous silicon layer 18. For example, the oxidation rate of the polysilicon layer 16 is approximately 2.5–3 times greater than the oxidation rate of the amorphous silicon layer 18. This oxidation process defines a gate electrode 21 Å comprised of the layer of polysilicon 16, having a post-oxidation width 24, and a layer of amorphous silicon 18, having a post-oxidation width 22. The oxidation process may be performed at a temperature ranging from approximately 750–900° C. in an oxygen environment. During this process, the cap layer 14 comprised of, for example, silicon nitride, will not oxidize to any great extent. The duration of the oxidation process will vary depending upon the amount of oxidation desired.

As shown in FIG. 5, due to the oxidation process, the amorphous silicon layer 18 has been reduced to a second width 22 that is less than the original width 23 depicted in FIG. 4. Also note that the thickness of the amorphous silicon layer 18 has been somewhat reduced during the oxidation process. Moreover, the width 24 of the polysilicon layer 16 has been reduced to a width that is less than the original width 23 of the polysilicon layer 16 depicted in FIG. 4. Additionally, note that, after the oxidation process is performed, the width 22 of the amorphous silicon layer 18 is greater than the width 24 of the polysilicon layer 16. For example, assuming that the originally patterned width 23 of the amorphous silicon layer 18 and the polysilicon layer 16 is approximately 1200 Å, the oxidation process may be performed until such time as the post-oxidation width 22 of the amorphous silicon layer 18 is approximately 1000 Å, whereas the post-oxidation width 24 of the polysilicon layer 16 is approximately 600 Å. Stated another way, the sidewall 18A of the amorphous silicon layer 18 extends beyond the sidewall 16A of the polysilicon layer 16 by a distance 31 of approximately 200 Å. Stated yet another way, depending upon the original patterned width 23 of the gate structure 21, and the degree to which the amorphous silicon layer 18 and the polysilicon layer 16 are oxidized, the post-oxidation width 24 of the polysilicon layer 16 may end up being approximately 50–90% of the post-oxidation width 22 of the amorphous silicon layer 18. Of course, it should be understood that the numerical ranges are provided by way of example only, and they should not be considered a limitation of the present invention unless such limitations are specifically recited in the claims.

Figure 6:
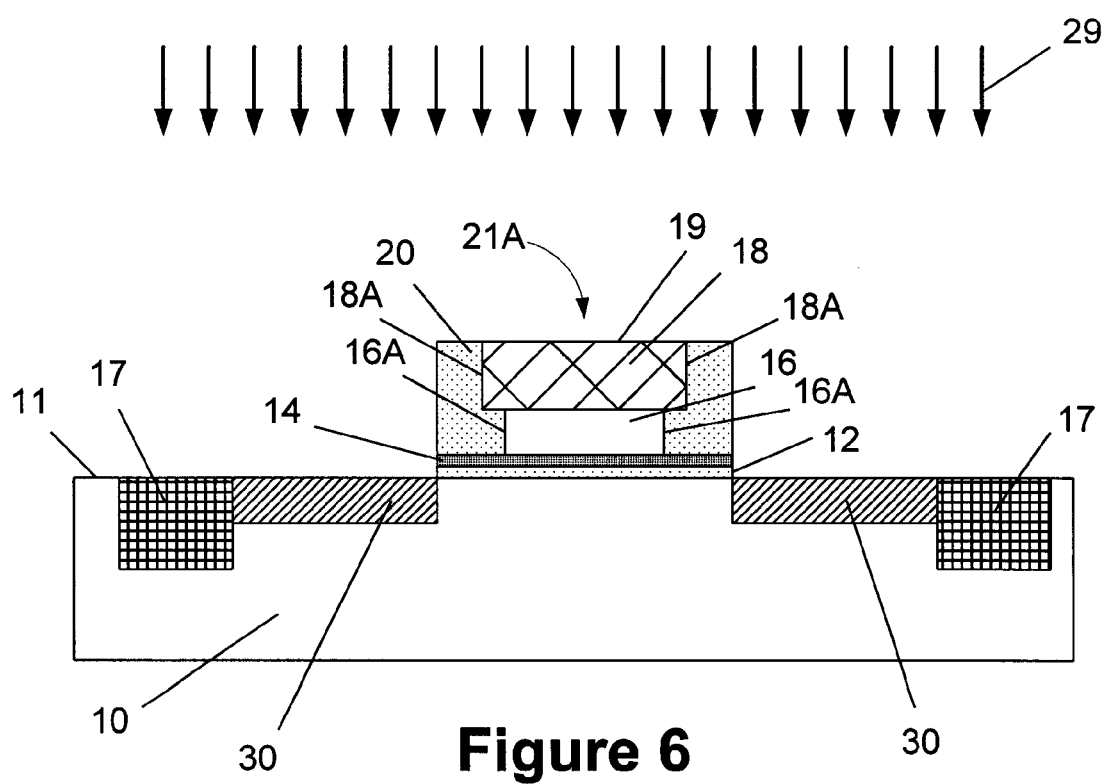
FIG. 6 is a cross-sectional view of the device shown in FIG. 5 after one or more etching processes have been performed and a source/drain ion implantation process has been performed.

Next, as shown in FIG. 6, one or more etching processes are performed to remove the cap layer 14. For example, an isotropic etching process may be used to remove a cap layer 14 comprised of silicon nitride. Thereafter, an etching process is performed to remove unwanted portions of the gate insulation layer 12 above the surface 11 of the substrate 10 and above the surface 19 of the amorphous silicon layer 18. In certain situations where the gate insulation layer 12 and the cap layer 14 are comprised of the same material, e.g., silicon nitride, only a single etching process may be required.

Thereafter, a variety of ion implantation processes will be performed to form source/drain regions for the completed device. Thus, the particular methodologies described herein to form the completed source/drain regions should not be considered a limitation of the present invention unless such methods are specifically recited in the attached claims. In one illustrative embodiment, depicted in FIGS. 6–8, the ion implantation processes used to form the source/drain regions are performed as follows. As shown in FIG. 6, an ion implantation process 29 is performed at a relatively high dopant concentration to form source/drain implant regions 30. In one illustrative embodiment, the dopant concentrations for the ion implantation process may range from $8 \times 10^{14}$ to $6 \times 10^{15}$ ions/cm² of the appropriate dopant atoms, e.g., arsenic or phosphorus for NMOS devices, boron for PMOS devices, etc. Moreover, the implantation process may be performed at an energy level ranging from approximately 1–20 keV.

Figure 7:
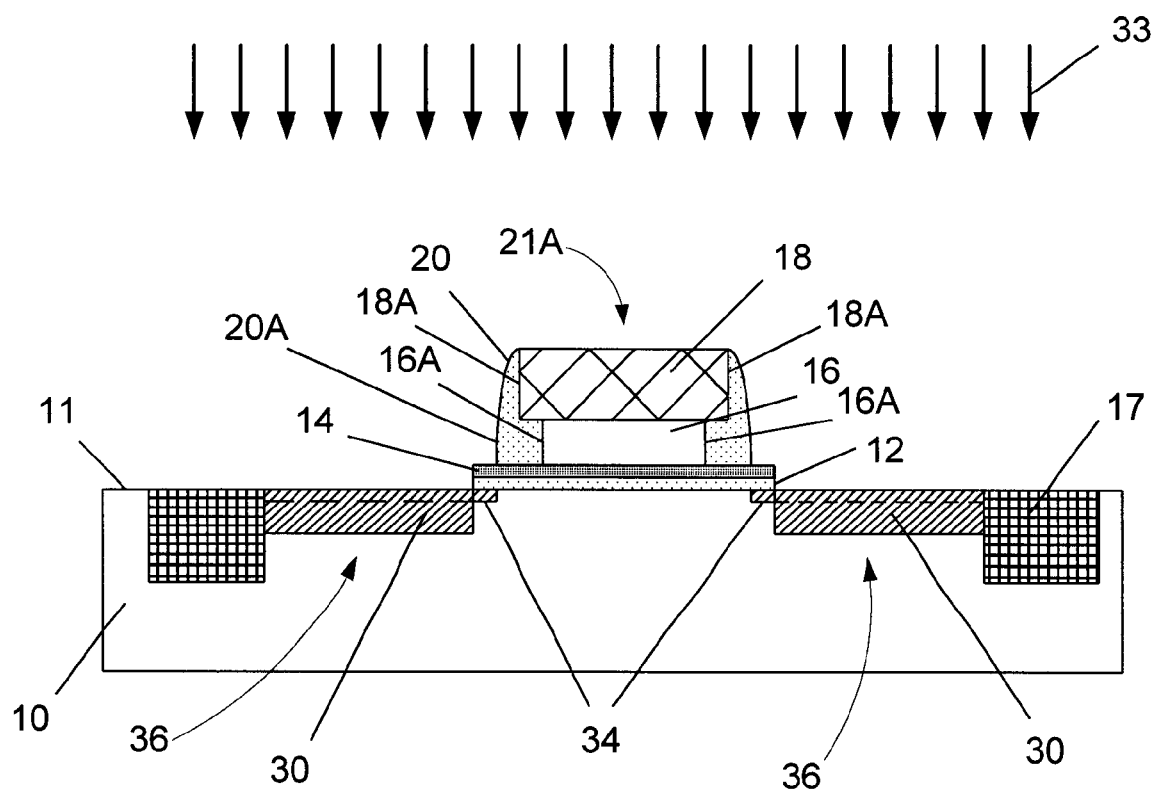
FIG. 7 is a cross-sectional view of the device shown in FIG. 6 after an extension implantation process has been performed.
Figure 8:
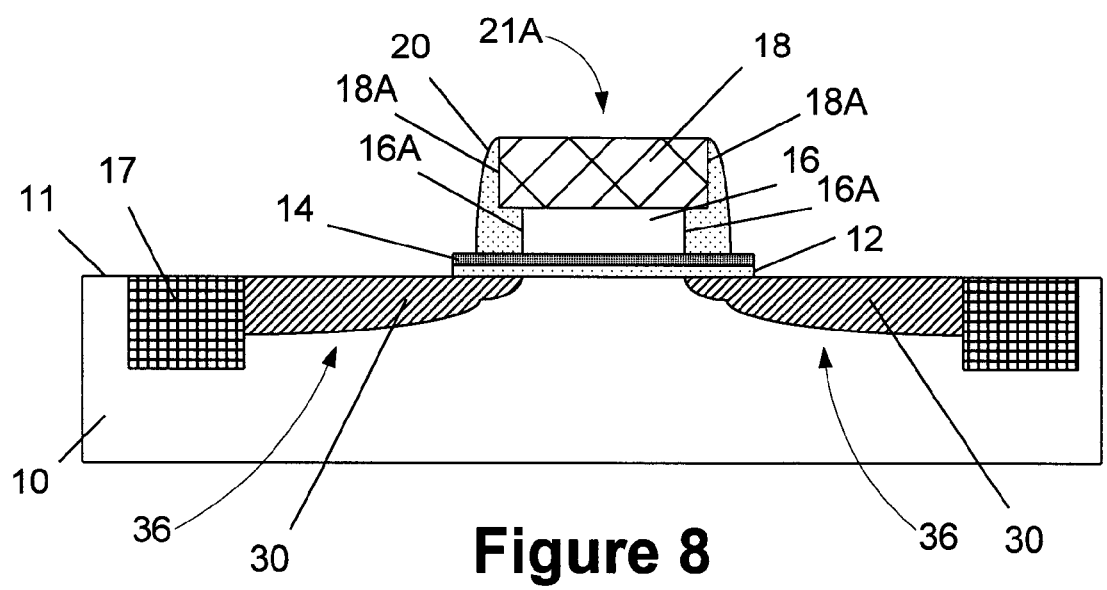
FIG. 8 is a cross-sectional view of the device shown in FIG. 7 after one or more anneal processes have been performed on the device.

Thereafter, as shown in FIG. 7, if desired, a subsequent etching process may be performed to essentially form sidewall spacers 20A from the previously grown oxide material 20. This may be accomplished by performing an additional anisotropic etching process, e.g., a plasma etching process, to produce the sidewall spacer 20A. Alternatively, if additional spacer width is desired, a separate layer of spacer material (not shown), e.g., silicon dioxide, may be formed above the gate electrode 21A and thereafter etched using an anisotropic etching process to define such a spacer.

Thereafter, an ion implantation process 33 is performed to form extension implant regions 34 in the substrate 10. For an illustrative NMOS device, the implant process 33 may be comprised of arsenic at a concentration level ranging from approximately $5 \times 10^{14}$–$2 \times 10^{15}$ ions/cm² at an energy level ranging from approximately 1–5 keV. Dashed lines are used to indicate the implanted location of the extension implant regions 34 in the previously implanted source/drain implant regions 30. Note that, as implanted, the extension implant regions 34 are generally self-aligned with respect to the sidewall spacer 20A. The energy for the implant process 33 will be adjusted to insure the dopant atoms penetrate the residual portions of the cap layer 14 and the gate insulation layer 12 that extend beyond the spacer 20A. Thereafter, one or more anneal processes may be performed to activate the implanted dopant atoms and to repair any damage to the lattice structure of the semiconducting substrate due to the various ion implantation processes. This results in the source/drain regions 36 depicted in FIG. 8. Other implant processes, such as halo implant processes, may be performed on the device although the resulting doped regions from those implant processes are not indicated in the drawings. Thereafter, metal silicide contacts may be formed above the source/drain regions 36 and the amorphous silicon layer 18 using traditional processing techniques.

The present invention is directed to a transistor device and a method of making such a transistor. In one illustrative embodiment, the transistor is comprised of a substrate 10, a gate insulation layer 12 positioned above the substrate 10, and a gate electrode 21A positioned above the gate insulation layer 12. The gate electrode 21A is comprised of a layer of polysilicon 16 having a width 24 and a layer of amorphous silicon 18 positioned above the layer of polysilicon 16, wherein the layer of amorphous silicon 18 has a width 22 that is greater than the width 24 of the layer of polysilicon 16. The transistor further comprises a source region and a drain region formed in the substrate adjacent the gate electrode 21A.

In one illustrative embodiment, the inventive method of forming a transistor comprises forming a gate insulation layer 12 above a semiconducting substrate 10, forming a layer of polysilicon 16 above the gate insulation layer 12, forming a layer of amorphous silicon 16 on the layer of polysilicon 16 and patterning the layer of polysilicon 16 and the layer of amorphous silicon 18 to a first width 23 to thereby define a gate structure 21. The method further comprises reducing the first width 23 of the layer of polysilicon 16 and the layer of amorphous silicon 18 by performing an oxidation process, wherein the layer of polysilicon 16 has a post-oxidation width 24 that is less than the post-oxidation width 22 of the layer of amorphous silicon 18, and forming a plurality of source/drain regions in the substrate adjacent the gate electrode 21A.

By limiting or reducing the extent to which the extension implant portion of the completed source/drain regions 36 extends under the gate electrode 21A of the device, performance can be improved. Pursuant to the present invention, due to the post-oxidation width 24 of the polysilicon portion 16 of the gate electrode 21A, the parasitic capacitance resulting from the overlap of the gate electrode 21A with the source/drain regions is reduced, thereby allowing increased device performance. Even very small improvements in this area can increase device performance. Additionally, in the structure depicted in FIG. 8, the upper portion of the gate electrode 21A, i.e., the amorphous silicon layer 18, is wider than the underlying polysilicon layer 16, thereby allowing better electrical contact to the gate electrode 21A.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of forming a transistor, comprising:

forming a gate insulation layer on a semiconducting substrate;

forming a layer of polysilicon above said gate insulation layer;

forming a layer of amorphous silicon above said layer of polysilicon;

patterning said layer of polysilicon and said layer of amorphous silicon to a first width to thereby define a gate structure;

reducing the first width of said layer of polysilicon and said layer of amorphous silicon by performing an oxidation process, said layer of polysilicon having a post-oxidation width that is less than a post-oxidation width of said layer of amorphous silicon; and forming a plurality of source/drain regions in said substrate adjacent said gate structure.

2. The method of claim 1, wherein forming a gate insulation layer above a semiconducting substrate comprises forming a gate insulation layer on a semiconducting substrate by at least one of a deposition process and a thermal growth process.

3. The method of claim 1, wherein forming a gate insulation layer above a semiconducting substrate comprises forming a gate insulation layer comprised of at least one of silicon dioxide, an oxide, a nitrogen-bearing oxide, silicon nitride, and a material having a dielectric constant greater than 8 above a semiconducting substrate.

4. The method of claim 1, wherein forming a layer of polysilicon above said gate insulation layer comprises forming a layer of polysilicon having a thickness ranging from approximately 100–300 Å above said gate insulation layer.

5. The method of claim 1, wherein forming a layer of amorphous silicon on said layer of polysilicon comprises forming a layer of amorphous silicon having a thickness ranging from approximately 500–1500 Å on said layer of polysilicon.

6. The method of claim 1, wherein patterning said layer of polysilicon and said layer of amorphous silicon to a first width to thereby define a gate structure comprises patterning said layer of polysilicon and said layer of amorphous silicon to a width to thereby define a gate structure by performing at least one etching process.

7. The method of claim 1, wherein forming said layer of polysilicon and forming said layer of amorphous silicon comprises forming said layer of polysilicon in a deposition chamber at a temperature ranging from approximately 600–640° C. and forming a layer of amorphous silicon in the same deposition chamber at a temperature ranging from approximately 520–580° C.

8. The method of claim 1, wherein said layer of polysilicon and said layer of amorphous silicon are formed in separate deposition chambers.

9. The method of claim 1, further comprising forming a capping layer comprised of at least one of silicon nitride, tantalum nitride and titanium nitride above said gate insulation layer prior to the formation of said layer of polysilicon.

10. The method of claim 1, wherein said post-oxidation width layer of polysilicon is approximately 50–90% of the post-oxidation width of said layer of amorphous silicon.

11. A method of forming a transistor, comprising:

forming a gate insulation layer on a semiconducting substrate;

depositing a layer of polysilicon above said gate insulation layer;

depositing a layer of amorphous silicon above said layer of polysilicon;

etching said layer of polysilicon and said layer of amorphous silicon to a first width to thereby define a gate structure;

reducing the first width of said layer of polysilicon and said layer of amorphous silicon by performing an oxidation process, said layer of polysilicon having a post-oxidation width that is approximately 50–90% of a post-oxidation width of said layer of amorphous silicon; and forming a plurality of source/drain regions in said substrate adjacent said gate structure.

12. The method of claim 11, wherein forming a gate insulation layer above a semiconducting substrate comprises forming a gate insulation layer on a semiconducting substrate by at least one of a deposition process and a thermal growth process.

13. The method of claim 11, wherein forming a gate insulation layer above a semiconducting substrate comprises forming a gate insulation layer comprised of at least one of silicon dioxide, an oxide, a nitrogen-bearing oxide, silicon nitride, and a material having a dielectric constant greater than 8 above a semiconducting substrate.

14. The method of claim 11, wherein depositing a layer of polysilicon above said gate insulation layer comprises depositing a layer of polysilicon having a thickness ranging from approximately 100–300 Å above said gate insulation layer.

15. The method of claim 11, wherein depositing a layer of amorphous silicon on said layer of polysilicon comprises depositing a layer of amorphous silicon having a thickness ranging from approximately 500–1500 Å on said layer of polysilicon.

16. The method of claim 11, wherein etching said layer of polysilicon and said layer of amorphous silicon to a first width to thereby define a gate structure comprises performing at least one anisotropic etching process on said layer of polysilicon and said layer of amorphous silicon to a width to thereby define a gate structure.

17. The method of claim 11, wherein depositing said layer of polysilicon and depositing said layer of amorphous silicon comprises depositing said layer of polysilicon in a deposition chamber at a temperature ranging from approximately 600–640° C. and depositing a layer of amorphous silicon in the same deposition chamber at a temperature ranging from approximately 520–580° C.

18. The method of claim 11, wherein said layer of polysilicon and said layer of amorphous silicon are deposited in separate deposition chambers.

19. The method of claim 11, further comprising forming a capping layer comprised of at least one of silicon nitride, tantalum nitride and titanium nitride above said gate insulation layer prior to depositing said layer of polysilicon.

* * * * *